(12) United States Patent
Sim et al.

(10) Patent No.: US 12,101,962 B2
(45) Date of Patent: Sep. 24, 2024

(54) DISPLAY DEVICE

(71) Applicant: Samsung Display Co., Ltd., Yongin-si (KR)

(72) Inventors: Jeong Myo Sim, Gangneung-si (KR); Kyunghee Lee, Suwon-si (KR); Mihwa Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 492 days.

(21) Appl. No.: 17/455,193

(22) Filed: Nov. 16, 2021

(65) Prior Publication Data
US 2022/0285652 A1     Sep. 8, 2022

(30) Foreign Application Priority Data

Mar. 5, 2021  (KR) .................. 10-2021-0029711

(51) Int. Cl.
| | |
|---|---|
| *H01L 51/52* | (2006.01) |
| *H10K 50/84* | (2023.01) |
| *H10K 50/86* | (2023.01) |
| *H10K 59/12* | (2023.01) |
| *H10K 59/38* | (2023.01) |
| *H10K 59/40* | (2023.01) |

(52) U.S. Cl.
CPC ......... *H10K 50/846* (2023.02); *H10K 50/865* (2023.02); *H10K 59/12* (2023.02); *H10K 59/38* (2023.02); *H10K 59/40* (2023.02)

(58) Field of Classification Search
None
See application file for complete search history.

(56) References Cited

U.S. PATENT DOCUMENTS

| | | |
|---|---|---|
| 2015/0352521 A1 | 12/2015 | Lee et al. |
| 2018/0175115 A1 | 6/2018 | Choi et al. |
| 2024/0032405 A1* | 1/2024 | Jeong .................. H10K 59/873 |

FOREIGN PATENT DOCUMENTS

| | | |
|---|---|---|
| JP | 4691406 B2 | 6/2011 |
| JP | 2020-126182 A | 8/2020 |
| KR | 10-1591606 B1 | 2/2016 |
| KR | 10-2020-0100570 A | 8/2020 |

* cited by examiner

*Primary Examiner* — Long Pham
(74) *Attorney, Agent, or Firm* — Lewis Roca Rothgerber Christie LLP (57) ABSTRACT

A display device includes a display panel and a light control layer disposed on the display panel. The light control layer includes a base portion, a coloring agent having a maximum absorption wavelength in a wavelength range equal to or greater than about 580 nm and equal to or smaller than about 600 nm, and a desiccant.

20 Claims, 6 Drawing Sheets

DISPLAY DEVICE

CROSS-REFERENCE TO RELATED APPLICATION

This application claims priority to and the benefit of Korean Patent Application No. 10-2021-0029711, filed on Mar. 5, 2021, the entire content of which is hereby incorporated by reference.

BACKGROUND

1. Field

One or more aspects of embodiments of the present disclosure relate to a display device. For example, embodiments of the present disclosure relate to a display device including a light control layer that contains a coloring agent.

2. Description of the Related Art

Various types (kinds) of display devices that are applied to multimedia devices, such as television sets, mobile phones, tablet computers, game units, and/or the like, are being developed. The display devices include a variety of optical functional layers to provide color images with superior quality to users.

In recent years, studies on a display device having a thin thickness are being conducted to implement one or more suitable types (kinds) of display devices, such as a display device including a curved surface, a rollable display device, or a foldable display device.

SUMMARY

One or more aspects of embodiments of the present disclosure are directed toward a display device including a light control layer with improved moisture resistance.

One or more embodiments of the present disclosure provide a display device including a display panel and a light control layer disposed on the display panel, the light control layer including a base portion, a coloring agent having a maximum absorption wavelength in a wavelength range equal to or greater than about 580 nm and equal to or smaller than about 600 nm (e.g., a wavelength range of about 580 nm to about 600 nm), and a desiccant.

The desiccant may be in a first state before absorbing a moisture and in a second state after absorbing the moisture, and a color of the desiccant in the first state may be the same as a color of the desiccant in the second state.

The desiccant may be to transmit (e.g., may transmit, or be configured to transmit) visible light.

The light control layer may include about 0.01 wt % or more and about 5.00 wt % or less (e.g., about 0.01 wt % to about 5.00 wt %) of the desiccant with respect to a total content of the light control layer.

The desiccant includes at least one selected from CaO, MgO, $CaCl_2$, $CaCO_3$, $CaZrO_3$, $CaTiO_3$, $SiO_2$, $Ca_2SiO_4$, $MgCl_2$, $P_2O_5$, $Li_2O$, $Na_2O$, BaO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$, and $Mg(ClO_4)_2$.

The coloring agent includes at least one selected from an anthraquinone-based compound, a phthalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, and a cyanine-based compound.

The light control layer includes about 0.01 wt % or more and about 5.00 wt % or less (e.g., about 0.01 wt % to about 5.00 wt %) of the coloring agent with respect to a total content of the light control layer.

The coloring agent has a higher hydrophobicity than the desiccant.

The display device may further include a barrier wall. The display panel includes a base layer and a display element layer disposed on the base layer, the base layer including a light emitting area and a non-light-emitting area. The barrier wall is disposed on the display element layer, is covered by the light control layer, and overlaps the non-light-emitting area.

The display device may further include a sensor layer disposed between the display panel and the light control layer, and the sensor layer may be disposed directly on the display panel.

The base portion is formed utilizing (e.g., includes) a base resin including at least one selected from an acrylate monomer and an epoxy monomer.

The base resin includes about 25 wt % or more and about 35 wt % or less (e.g., about 25 wt % to about 35 wt %) of at least one selected from the acrylate monomer and the epoxy monomer, about 0.01 wt % or more and about 5.00 wt % or less (e.g., about 0.01 wt % to about 5.00 wt %) of a photoinitiator, about 25 wt % or more and about 35 wt % or less (e.g., about 25 wt % to about 35 wt %) of a curable resin, where the remainder (e.g., remaining weight) of the base resin includes or is composed of additives.

One or more embodiments of the present disclosure provide a display device including a display panel including first, second, and third light emitting elements spaced apart from each other when viewed in a plane, where the first, second, and third light emitting elements are to emit lights having different wavelengths from each other, and a light control layer disposed on the display panel and including a base portion, a coloring agent having a maximum absorption wavelength in a wavelength range equal to or greater than about 580 nm and equal to or smaller than about 600 nm (e.g., about 580 nm to about 600 nm), and a desiccant.

Each of the first, second, and third light emitting elements includes a first electrode, a hole transport region disposed on the first electrode, a light emitting layer disposed on the hole transport region, an electron transport region disposed on the light emitting layer, a second electrode disposed on the electron transport region, and a capping layer disposed on the second electrode.

The first light emitting element may be to emit a red light, the second light emitting element may be to emit a green light, and the third light emitting element may be to emit a blue light.

The light control layer may overlap the first, second, and third light emitting elements.

The display device may further include a barrier wall. The display panel may include a display element layer including a light emitting area in which the first, second, and third light emitting elements are disposed and a non-light-emitting area disposed between the light emitting areas, where the barrier wall is disposed on the display element layer, is covered by the light control layer, and overlaps the non-light-emitting area.

The barrier wall may include a black pigment and/or a black dye.

The light control layer may include about 0.01 wt % or more and about 5.00 wt % or less (e.g., about 0.01 wt % to about 5.00 wt %) of the desiccant with respect to a total content of the light control layer.

The light control layer includes about 0.01 wt % or more and about 5.00 wt % or less (e.g., about 0.01 wt % to about 5.00 wt %) of the coloring agent with respect to a total content of the light control layer.

According to the above, the moisture resistance of the light control layer may be improved, and the color reproduction rate of the display device including the light control layer may be maintained in a high temperature and/or high moisture environment.

BRIEF DESCRIPTION OF THE DRAWINGS

The above and other advantages of the present disclosure will become readily apparent by reference to the detailed description when considered in conjunction with the accompanying drawings, wherein.

DETAILED DESCRIPTION

The subject matter of the present disclosure may be variously modified and realized in many different forms, and selected embodiments will be described in more detail herein with reference to the drawings. However, the present disclosure is not limited to the disclosed forms, and should be construed to include all modifications, equivalents, and/or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

In contrast, when an element is referred to as being "directly on," "directly connected," or "directly coupled" to another element, there are no intervening elements present between a layer, film region, or substrate and another layer, film, region, or substrate. For example, the term "directly connected" indicates that two layers or two members may be disposed without employing additional adhesive(s) therebetween.

Like numerals refer to like elements throughout, and duplicative descriptions thereof may not be provided. In the drawings, the thicknesses, ratios, and/or dimensions of components may be exaggerated for effective description of the technical content. As used herein, the term "and/or" includes any and all combinations of one or more of the associated listed items.

It will be understood that, although the terms first, second, etc. may be used herein to describe various elements, the elements are not limited by such terms. These terms are only used to distinguish one element from another element. Thus, a first element discussed below could be alternatively termed a second element without departing from the teachings of the present disclosure. As used herein, singular forms such as "a", "an," and "the" are intended to include plural forms as well and vice versa, unless the context clearly indicates otherwise.

Spatially relative terms, such as "beneath", "below", "lower", "above", "upper" and/or the like, may be used herein for ease of description to describe one element or feature's relationship to another element(s) or feature(s) as shown in the drawings.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (such as those defined in commonly used dictionaries, and including technical and scientific terms) used herein have the same meanings as commonly understood by one of ordinary skill in the art to which this disclosure belongs. It will be further understood that terms should be interpreted as having meanings that are consistent with their meanings in the context of the relevant art, and should not be interpreted in an idealized or overly formal sense unless expressly so defined herein.

As used herein, expressions such as "at least one of," "one of," and "selected from," when preceding a list of elements, modify the entire list of elements and do not modify the individual elements of the list. As used herein, the term "and/or" includes any and all combinations of one or more of the associated listed items. Further, the use of "may" when describing embodiments of the present disclosure refers to "one or more embodiments of the present disclosure".

Hereinafter, a display device will be explained in more detail with reference to the accompanying drawings.

Figure 1:
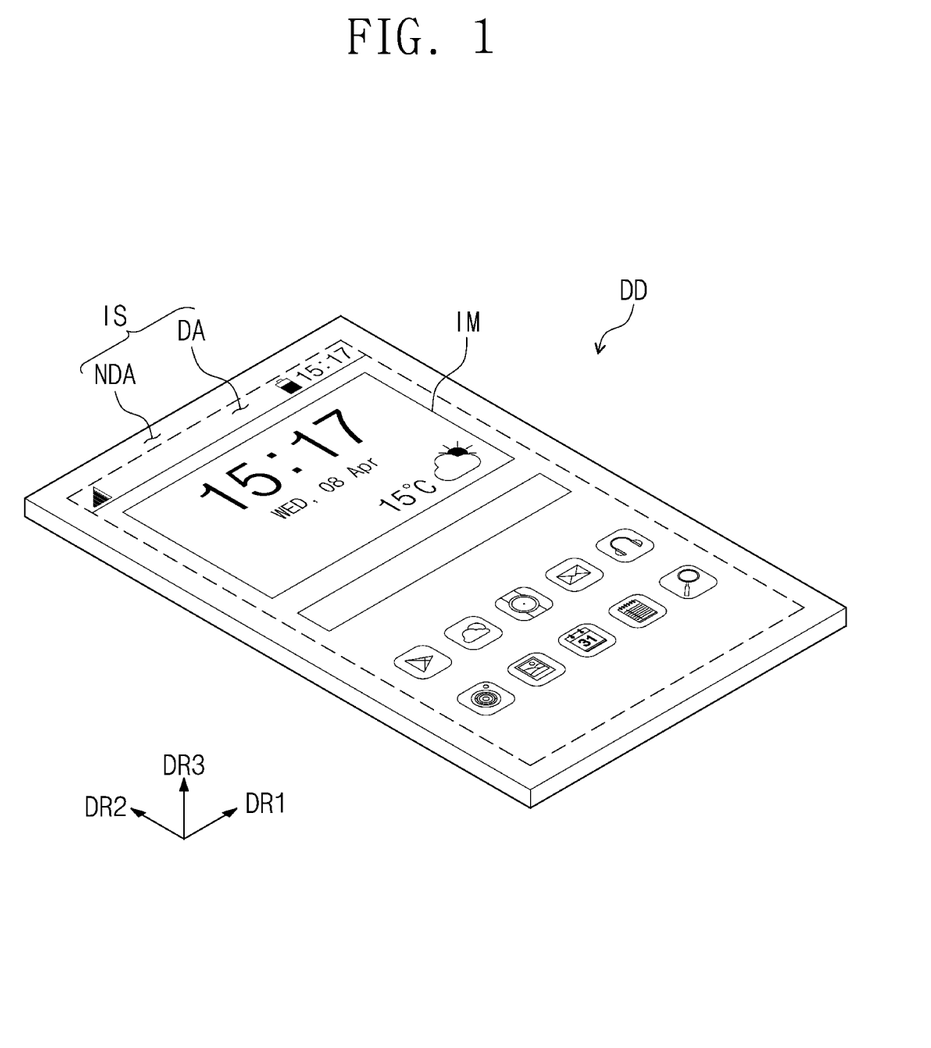
FIG. 1 is a perspective view showing a display device according to an embodiment of the present disclosure.

FIG. 1 is a perspective view showing a display device DD according to an embodiment of the present disclosure. FIG. 1 shows a mobile electronic device as a representative example of the display device DD. However, the display device DD may be applied to any suitable large-sized electronic item (such as a television set, a monitor, an outdoor billboard, and/or the like) or small or medium-sized electronic item (such as a personal computer, a notebook computer, a personal digital assistant, a car navigation unit, a game unit, a smartphone, a tablet computer, a camera, and/or the like). The display device DD may be applied to various other electronic devices within the spirit and scope of the present disclosure.

In some embodiments, the display device DD may have a prismatic or a hexahedron shape having a thickness in (along) a third directional axis DR3 with respect to a plane (e.g., image plane) defined by a first directional axis DR1 and a second directional axis DR2 crossing the first directional axis DR1. However, this is merely one example, and the display device DD may have a variety of suitable shapes.

As shown in the embodiments of the drawings, upper (or front) and lower (or rear) surfaces of each member may be defined with respect to a direction in which an image IM is displayed. The front and rear surfaces are opposite to each other in the third directional axis DR3, and a normal line direction of each of the front and lower surfaces may be substantially parallel to the third directional axis DR3 (e.g., the front and rear surfaces are coincident with planes oriented normal or perpendicular to the third directional axis DR3).

The directions indicated by the first, second, and third directional axes DR1, DR2, and DR3 are relative to each other, and may be changed (e.g., renamed) to other directions. Hereinafter, the first, second, and third directions respectively correspond to directions indicated by the first, second, and third directional axes DR1, DR2, and DR3, and are respectively assigned with the same reference numerals as the first, second, and third directional axes DR1, DR2, and DR3.

The display device DD may display the image IM through a display surface IS. The display surface IS may include a display area DA in which the image IM is displayed and a non-display area NDA defined adjacent to the display area DA. The image IM is not displayed through (e.g., may not be visible within) the non-display area NDA. The image IM may include a video and/or a still image. FIG. 1 shows a plurality of application icons and a clock widget as representative examples of the image IM.

The display area DA may have a quadrangular (e.g., rectangular) shape. The non-display area NDA may be around one or more sides (e.g., surround the perimeter) of the display area DA. However, embodiments of the present disclosure are not limited thereto, and for example, the shape of the display area DA and the shape of the non-display area NDA may be designed relative to each other. In some embodiments, the non-display area NDA may not exist (e.g., may not be included) on a front surface of the display device DD.

The display device DD may be flexible. For example, the display device DD may have a flexible property, and in some states or embodiments, the display device DD may be fully bent (e.g., may be folded, warped, or curved in response to an applied force) or may be fully or slightly bent. For example, the display device DD may be a curved display device or a foldable display device, however, it is not limited thereto or thereby. According to an embodiment, for example, the display device DD may be rigid (e.g., non-bendable).

Figure 2:
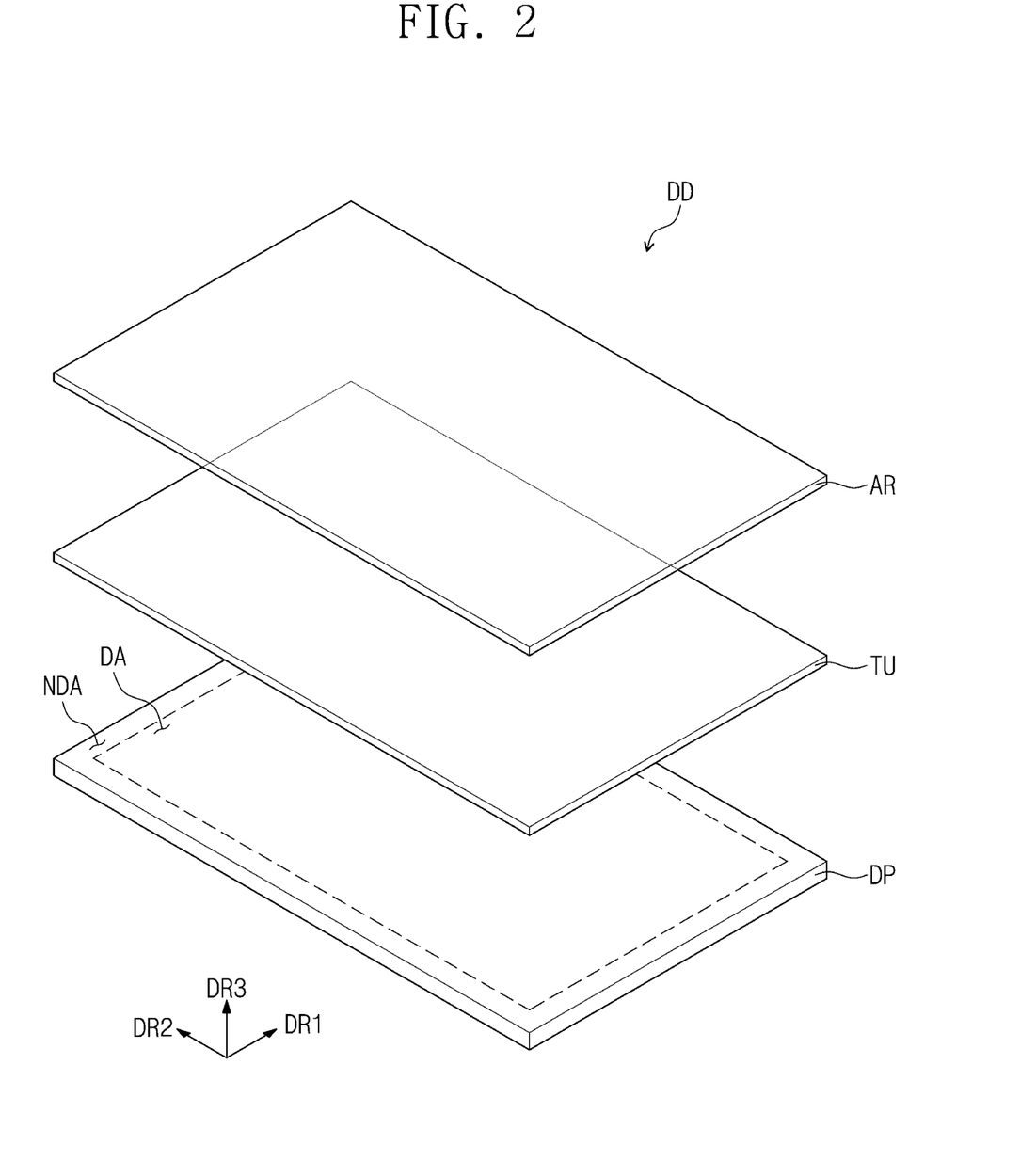
FIG. 2 is an exploded perspective view showing a display device according to an embodiment of the present disclosure.

FIG. 2 is an exploded perspective view showing the display device DD according to an embodiment of the present disclosure. Referring to FIG. 2, the display device DD may include a display panel DP, a sensor layer TU, and a light control layer AR, which are sequentially stacked in the third direction DR3.

The display panel DP may include a plurality of pixels in an area corresponding to the display surface IS. The pixels may correspond to each of a plurality of light emitting areas PXA-R, PXA-B, and PXA-G (refer to FIG. 3). The pixels may generate lights in response to electrical signals. The display area DA may display the image IM corresponding to the lights generated by the pixels.

According to an embodiment, the display panel DP may be a light emitting display panel. As an example, the display panel DP may be a micro-LED display panel, a nano-LED display panel, an organic light emitting display panel, or a quantum dot light emitting display panel. However, these are non-limiting examples. The display panel DP may be any suitable light emitting display panel.

A light emitting layer of the organic light emitting display panel may include an organic light emitting material. A light emitting layer of the quantum dot light emitting display panel may include a quantum dot and/or a quantum rod. The micro-LED display panel may include a micro-light emitting diode that is a micro-light emitting element, and the nano-LED display panel may include a nano-light emitting diode. Hereinafter, the organic light emitting display panel will be described as the display panel DP.

The light control layer AR may be disposed on the display panel DP. The light control layer AR may be an anti-reflective layer to reduce a reflectance of an external light incident thereto from the outside. The light control layer AR may selectively transmit light(s) exiting from (e.g., produced by) the display panel DP.

The sensor layer TU may be disposed between the display panel DP and the light control layer AR. The sensor layer TU may obtain information required to generate images in the display panel DP in response to an external input applied thereto. The external input may be a user input. The user input may include one or more suitable forms of external input (such as a part of a user's body, light, heat, pen, and/or pressure).

Figure 3:
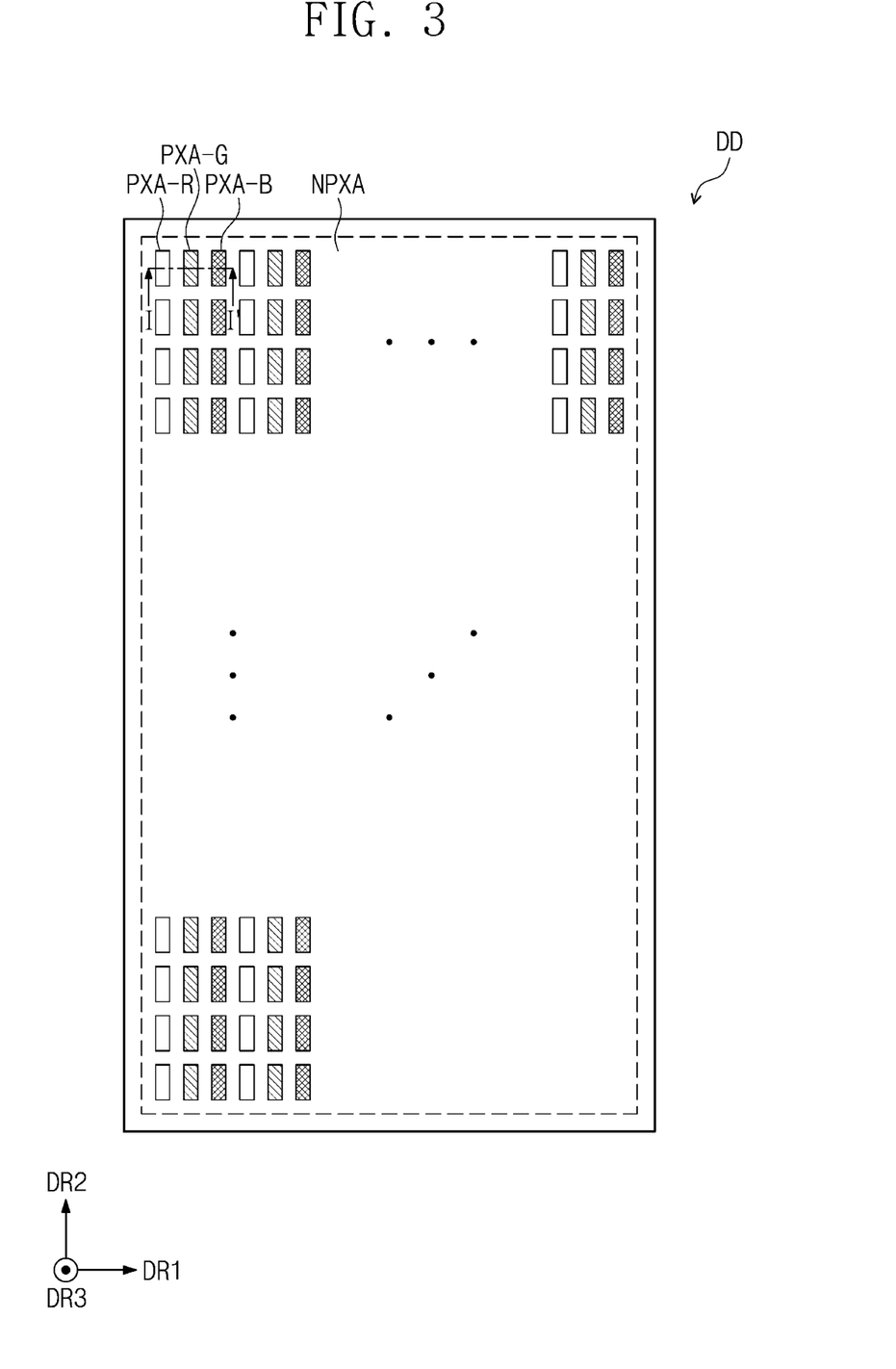
FIG. 3 is a plan view showing a display device according to an embodiment of the present disclosure.
Figure 4:
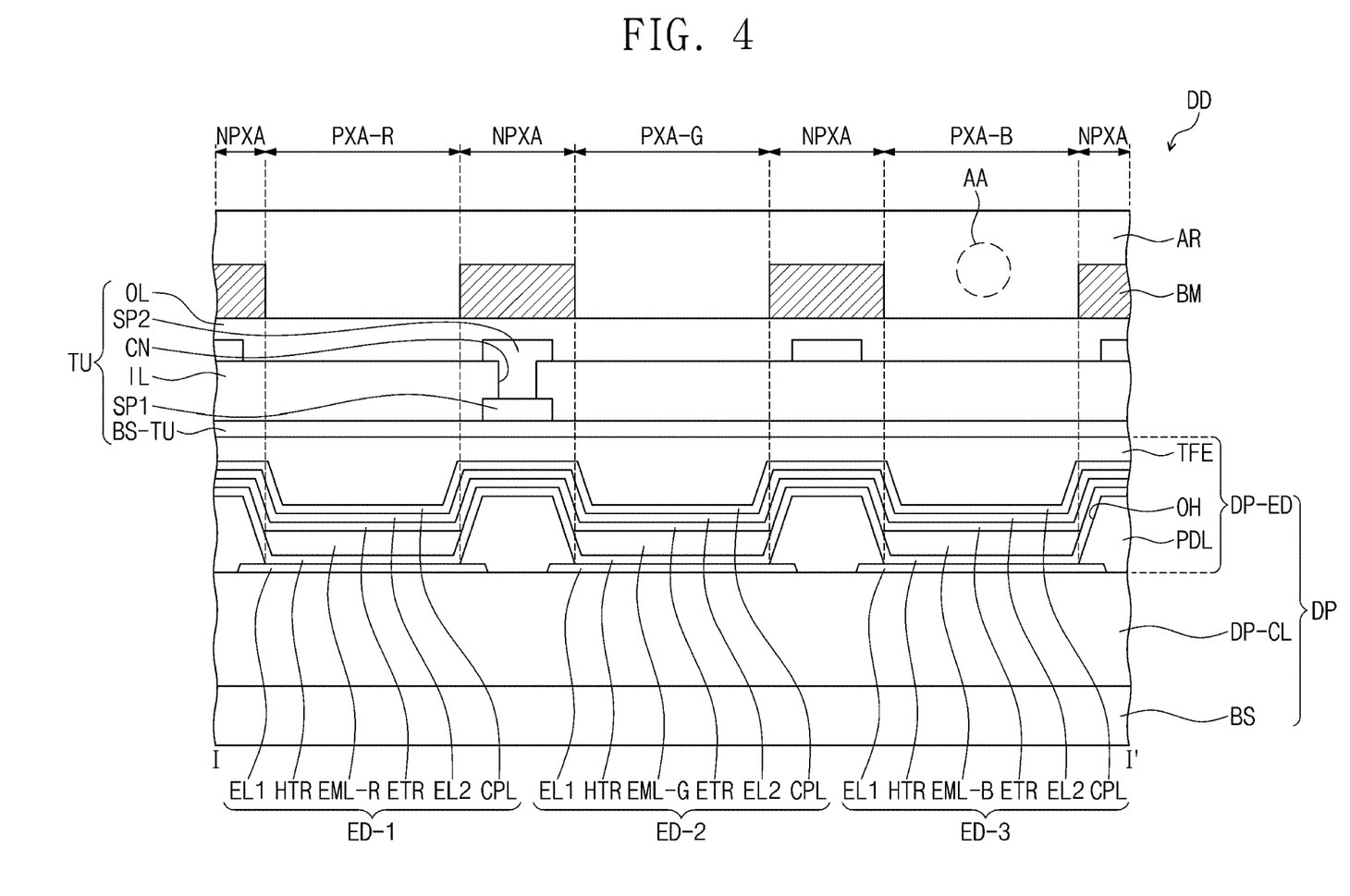
FIG. 4 is a cross-sectional view showing a display device according to an embodiment of the present disclosure.

FIG. 3 is a plan view showing the display device DD according to an embodiment of the present disclosure, and FIG. 4 is a cross-sectional view taken along a line I-I' of FIG. 3 to show the display device DD according to an embodiment of the present disclosure.

Referring to FIGS. 3 and 4, the display panel DP may include a base layer BS, a circuit layer DP-CL, and a display element layer DP-ED, which are sequentially stacked. The display element layer DP-ED may include a pixel definition layer PDL, light emitting elements ED-1, ED-2, and ED-3 disposed in the pixel definition layer PDL, and an encapsulation layer TFE disposed on the light emitting elements ED-1, ED-2, and ED-3.

According to an embodiment, the circuit layer DP-CL may be disposed on the base layer BS. The circuit layer DP-CL may include a plurality of transistors. Each of the transistors may include a control electrode, an input electrode, and an output electrode. For example, the circuit layer DP-CL may include a switching transistor(s) and a driving transistor(s) to drive the light emitting elements ED-1, ED-2, and ED-3 of the display element layer DP-ED.

Each of the light emitting elements ED-1, ED-2, and ED-3 may include a first electrode EL1, a hole transport region HTR, respective light emitting layers EML-R, EML-G, and EML-B, an electron transport region ETR, a second electrode EL2, and a capping layer CPL.

FIG. 4 shows a structure in which the light emitting layers EML-R, EML-G, and EML-B, respectively included in the light emitting elements ED-1, ED-2, and ED-3, are disposed in openings OH defined through the pixel definition layer PDL and the hole transport region HTR, the electron transport region ETR, the second electrode EL2, and the capping layer CPL may be commonly disposed in the light emitting elements ED-1, ED-2, and ED-3. However, the present disclosure is not limited thereto or thereby. In some embodiments, the hole transport region HTR and the electron transport region ETR may be disposed in the openings OH defined through the pixel definition layer PDL after being patterned. As an example, according to an embodiment, the hole transport region HTR, the light emitting layers EML-R, EML-G, and EML-B, and the electron transport region ETR of the light emitting elements ED-1, ED-2, and ED-3 may each be patterned by an inkjet printing method.

The encapsulation layer TFE may cover the light emitting elements ED-1, ED-2, and ED-3. The encapsulation layer TFE may encapsulate the display element layer DP-ED. The encapsulation layer TFE may be a thin film encapsulation layer. The encapsulation layer TFE may include a single-layer structure or a multi-layer structure of layers stacked one on another. The encapsulation layer TFE may include at least one insulating layer. According to an embodiment, the encapsulation layer TFE may include at least one inorganic layer (hereinafter, referred to as an encapsulation inorganic layer). In some embodiments, the encapsulation layer TFE may include at least one organic layer (hereinafter, referred to as an encapsulation organic layer) and at least one encapsulation inorganic layer.

The encapsulation inorganic layer may protect the display element layer DP-ED from moisture and/or oxygen, and the encapsulation organic layer may protect the display element layer DP-ED from foreign substances (such as, for example, dust particles). The encapsulation inorganic layer may include silicon nitride, silicon oxynitride, silicon oxide, titanium oxide, and/or aluminum oxide, but is not limited thereto. The encapsulation organic layer may include an acrylic-based compound, an epoxy-based compound, and/or the like. The encapsulation organic layer may include an organic material that is photopolymerizable, but is not limited thereto. The encapsulation layer TFE may be disposed on the second electrode EL2 and may be disposed to fill the openings OH.

The display device DD may include a non-light-emitting area NPXA and the light emitting areas PXA-R, PXA-G, and PXA-B. Each of the light emitting areas PXA-R, PXA-G, and PXA-B may be an area from which light generated by a corresponding light emitting element among the light emitting elements ED-1, ED-2, and ED-3 exits. The light emitting areas PXA-R, PXA-G, and PXA-B may be spaced apart from each other when viewed in a plane.

Each of the light emitting areas PXA-R, PXA-G, and PXA-B may be defined by the pixel definition layer PDL. The non-light-emitting area NPXA may correspond to area(s) between the light emitting areas PXA-R, PXA-G, and PXA-B adjacent to each other, and for example may correspond to the pixel definition layer PDL. Each of the light emitting areas PXA-R, PXA-G, and PXA-B may correspond to a pixel. The pixel definition layer PDL may be defined (e.g., positioned) to distinguish (e.g., separate) the light emitting elements ED-1, ED-2, and ED-3 from each other. The light emitting layers EML-R, EML-G, and EML-B of the respective light emitting elements ED-1, ED-2, and ED-3 may be disposed in the openings OH defined through the pixel definition layer PDL to be distinguished from each other.

The light emitting areas PXA-R, PXA-G, and PXA-B may be grouped into a plurality of groups according to colors of the lights generated by the light emitting elements ED-1, ED-2, and ED-3. The display device DD shown in FIGS. 1 and 2 includes three light emitting areas PXA-R, PXA-G, and PXA-B respectively emitting red, green, and blue lights. As an example, the display device DD may include a red light emitting area PXA-R, a green light emitting area PXA-G, and a blue light emitting area PXA-B, which are distinguished from each other (e.g., spaced apart from each other).

According to an embodiment, the light emitting elements ED-1, ED-2, and ED-3 of the display device DD may be to emit lights having different wavelength ranges from each other. As an example, the display device DD may include a first light emitting element ED-1 to emit the red light, a second light emitting element ED-2 to emit the green light, and a third light emitting element ED-3 to emit the blue light. For example, the red light emitting area PXA-R, the green light emitting area PXA-G, and the blue light emitting area PXA-B of the display device DD may correspond to the first light emitting element ED-1, the second light emitting element ED-2, and the third light emitting element ED-3, respectively.

However, the present disclosure is not limited thereto or thereby, and the first, second, and third light emitting elements ED-1, ED-2, and ED-3 may be to emit lights having the same wavelength range as each other, or at least one selected from the first, second, and third light emitting elements ED-1, ED-2, and ED-3 may be to emit light having a wavelength range different from the others. As an example, all the first, second, and third light emitting elements ED-1, ED-2, and ED-3 may be to emit the blue light.

According to an embodiment, the light emitting areas PXA-R, PXA-G, and PXA-B of the display device DD may be arranged together in a stripe form. Referring to FIG. 3, each of a plurality of red light emitting areas PXA-R may be arranged together in the second directional axis DR2, a plurality of green light emitting areas PXA-G may be arranged together in the second directional axis DR2, and a plurality of blue light emitting areas PXA-B may be arranged together in the second directional axis DR2. In some embodiments, the red light emitting area PXA-R, the green light emitting area PXA-G, and the blue light emitting area PXA-B may be alternatingly arranged with each other in the first directional axis DR1.

In FIGS. 3 and 4, the light emitting areas PXA-R, PXA-G, and PXA-B are shown to be similar in size, however, embodiments are not limited thereto or thereby. According to an embodiment, the sizes of the light emitting areas PXA-R, PXA-G, and PXA-B may be different from each other depending on the wavelength ranges of the lights emitted therefrom. As referred to herein, the sizes of the light emitting areas PXA-R, PXA-G, and PXA-B may be sizes (e.g., planar areas) when viewed from a plane defined by the first directional axis DR1 and the second directional axis DR2.

The arrangement of the light emitting areas PXA-R, PXA-G, and PXA-B is not limited to that shown in FIG. 3, and an order in which the red light emitting area PXA-R, the green light emitting area PXA-G, and the blue light emitting area PXA-B are arranged may be provided in various suitable combinations according to the display quality characteristics desired for the display device DD. As an example, the light emitting areas PXA-R, PXA-G, and PXA-B may be arranged in a diamond shape (e.g., PENTILE® form (e.g., an RGBG matrix, RGBG structure, or RGBG matrix structure)) or a lozenge form. PENTILE® is a duly registered trademark of Samsung Display Co., Ltd.

In some embodiments, the light emitting areas PXA-R, PXA-G, and PXA-B may have different sizes from each other. As an example, the size of the green light emitting area PXA-G may be smaller than the size of the blue light emitting area PXA-B, however, it is not limited thereto or thereby.

According to an embodiment, the light control layer AR may be disposed on the display panel DP. The light control layer AR may entirely overlap the display element layer DP-ED. The light control layer AR may entirely overlap each of the first light emitting element ED-1, the second light emitting element ED-2, and the third light emitting element ED-3. The light control layer AR may be provided as one substantially continuous layer. The light control layer AR may cover a front surface of the display panel DP to protect the display panel DP. A portion of a light exiting from the display panel DP may be absorbed while passing through the light control layer AR, and a portion of the light exiting from the display panel DP may be transmitted, thereby improving a color reproduction rate. The term "color reproduction rate" refers to the range of color that is capable of being displayed by the display device. As an example, the color reproduction rate may be improved by selectively absorbing light in a specific wavelength range.

According to an embodiment, the display device DD may further include barrier walls BM that are disposed on the display element layer DP-ED, covered by the light control layer AR, and overlap the non-light-emitting area PXA. The barrier walls BM may be spaced apart from each other. The barrier walls BM may prevent or reduce light leakage from occurring. The barrier walls BM may be a light blocking member. The barrier walls BM may include an organic light blocking material, a black pigment, and/or a black dye. The light control layer AR may be filled in between the barrier walls BM spaced apart from each other.

According to an embodiment, the sensor layer TU may include a sensor base layer BS-TU, a first conductive layer SP1, an inorganic insulating layer IL, a second conductive layer SP2, and an organic insulating layer OL. The first conductive layer SP1 may be disposed on the sensor base layer BS-TU. The inorganic insulating layer IL may cover the first conductive layer SP1 and may be disposed on the sensor base layer BS-TU and the first conductive layer SP1. The second conductive layer SP2 may be disposed on the inorganic insulating layer IL. The organic insulating layer OL may cover the second conductive layer SP2 and may be disposed on the inorganic insulating layer IL and the second conductive layer SP2.

The sensor base layer BS-TU may be an inorganic layer containing one selected from silicon nitride, silicon oxynitride, and silicon oxide. According to an embodiment, the sensor base layer BS-TP may be an organic layer containing an epoxy resin, an acrylic resin, and/or an imide-based resin. The sensor base layer BS-TP may have a single-layer structure or a multi-layer structure of layers stacked in the third directional axis DR3.

Each of the first conductive layer SP1 and the second conductive layer SP2 may have a single-layer structure or a multi-layer structure of layers stacked in the third directional axis DR3. In some embodiments, the first and second conductive layers SP1 and SP2 may each have a single-layer structure, and may each include a metal layer and/or a transparent conductive layer. The metal layer may include molybdenum, silver, titanium, copper, aluminum, and/or alloys thereof. The transparent conductive layer may include a transparent conductive oxide (such as indium tin oxide (ITO), indium zinc oxide (IZO), zinc oxide (ZnO), and/or indium zinc tin oxide (IZTO)). In some embodiments, the transparent conductive layer may include a conductive polymer (e.g., PEDOT), a metal nanowire, and/or a graphene.

In some embodiments, the first and second conductive layers SP1 and SP2, may each have a multi-layer structure, may include a plurality of metal layers. The metal layers may have a three-layer structure of titanium(Ti)/aluminum (Al)/titanium(Ti). The first and second conductive layers SP1 and SP2 of the multi-layer structure may include at least one metal layer and at least one transparent conductive layer.

The inorganic insulating layer IL may include at least one selected from aluminum oxide, titanium oxide, silicon oxide, silicon oxynitride, zirconium oxide, and hafnium oxide.

The inorganic insulating layer IL may be provided with a contact hole CN defined therethrough. The first conductive layer SP1 and the second conductive layer SP2 may be connected to each other through the contact hole CN. The contact hole CN may be filled with the material of the second conductive layer SP2. FIG. 4 shows one contact hole CN defined through the inorganic insulating layer IL, however, the number of the contact holes CN is not limited thereto. According to an embodiment, a plurality of contact holes may be defined through the inorganic insulating layer IL.

The organic insulating layer OL may cover the inorganic insulating layer IL and the second conductive layer SP2. The organic insulating layer OL may include at least one selected from an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Figure 5A:
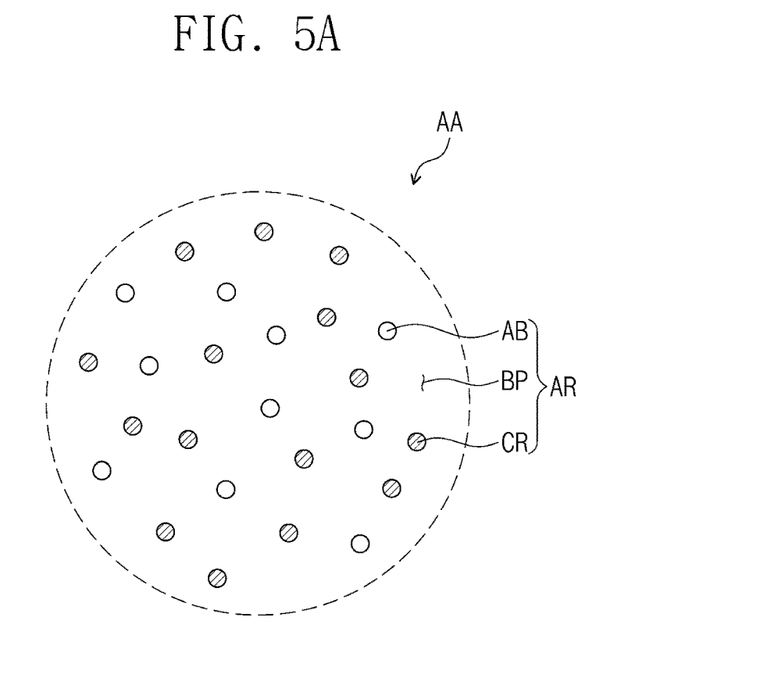
FIG. 5A is an enlarged view showing a portion of a display device according to an embodiment of the present disclosure.
Figure 5B:
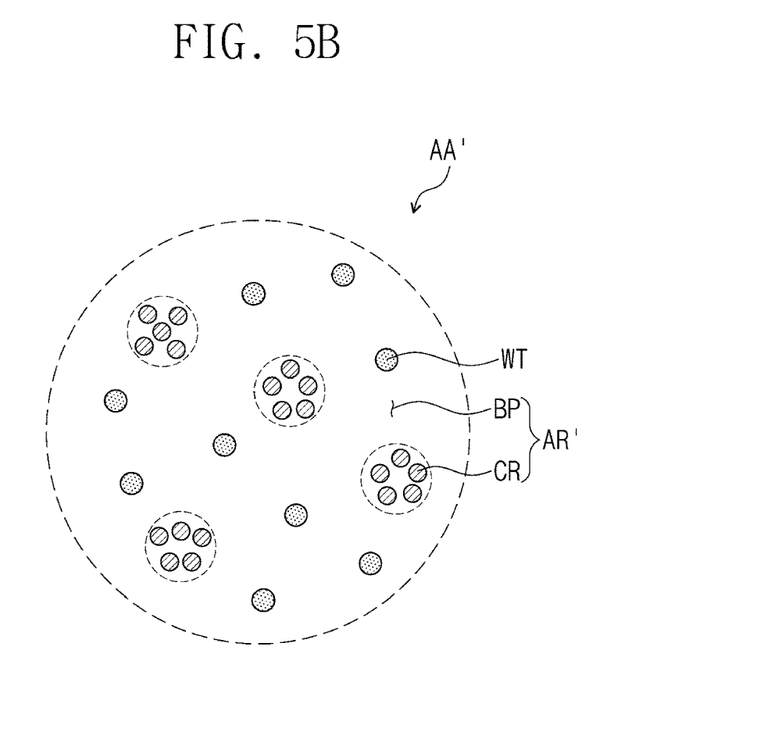
FIG. 5B is an enlarged view showing a portion of a display device according to a comparative example.

FIG. 5A is an enlarged view showing a portion of a display device according to an embodiment of the present disclosure. FIG. 5A is an enlarged view showing a portion AA of the display device, which is indicated by a dotted line in FIG. 4. FIG. 5B is an enlarged view showing a portion of a display device according to a comparative example. FIG. 5B is an enlarged view showing a portion AA', an alternative to the area indicated by the dotted line in FIG. 4, of the display device according to a comparative example. Referring to FIG. 5A, the light control layer AR may include a base portion BP, a coloring agent CR, and a desiccant AB. The coloring agent CR may transmit only a light in a set or specific wavelength range among lights emitted from the light emitting elements ED-1, ED-2, and ED-3, and thus, the color reproduction rate of the display device may be improved.

When the light control layer AR or AR' is in a high temperature and high moisture environment, external moisture WT may infiltrate the base portion BP. The coloring agent CR may have a hydrophobicity (e.g., may be hydrophobic). When the infiltrated moisture WT (FIG. 5B) is not removed, the coloring agent CR may be rearranged in the base portion BP due to a repulsive force between the moisture WT and the coloring agent CR. For example, an aggregation of the coloring agent CR may occur during the rearrangement of the coloring agent CR in the base portion BP. The light control layer AR may therefore include the desiccant AB to prevent or reduce aggregation of the coloring agent CR from occurring. The desiccant AB may be to absorb and remove the moisture WT (refer to FIG. 5B) in the base portion BP. The coloring agent CR may have a higher hydrophobicity than the desiccant AB. As the desiccant AB removes the moisture WT (refer to FIG. 5B) in the base portion BP, the aggregation of the coloring agent CR in the base portion BP may be prevented or reduced, and a decrease in the color reproduction rate of the display device DD (refer to FIG. 4) including the light control layer AR over time in the high temperature and high moisture environment may be prevented or reduced. For example, the light control layer AR of the embodiment example may include the desiccant AB, and thus, the moisture resistance may be improved.

Referring to FIG. 5B, different from the light control layer AR (refer to FIG. 5A), a light control layer AR' according to the comparative example may not include the desiccant AB (refer to FIG. 5A). A coloring agent CR may be rearranged in a base portion BP due to a repulsive force with the infiltrated moisture WT. The aggregation of the coloring agent CR may occur during the rearrangement of the base portion BP. When the coloring agent CR is aggregated, a transmittance of the light control layer AR' may be reduced, and the color reproduction rate of the light control layer AR' may decrease over time.

The coloring agent CR may have a maximum absorption wavelength in a wavelength range equal to or greater than about 580 nm and equal to or smaller than about 600 nm. The coloring agent CR may include at least one selected from an anthraquinone-based compound, a phthalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, and a cyanine-based compound.

In one or more embodiments, the coloring agent CR contained in the light control layer AR may be the squarylium-based compound having a strong light absorption property in the wavelength range equal to or greater than about 580 nm and equal to or smaller than about 600 nm. However, the coloring agent CR contained in the light control layer AR according to the present disclosure is not limited to the above-described compounds as long as the coloring agent CR includes compounds having the strong light absorption property in the above-described wavelength range.

A content (e.g., an amount) of the coloring agent CR contained in the light control layer AR may be equal to or greater than about 0.01 wt % and equal to or smaller than about 5.00 wt % with respect to a total content (e.g., a total amount) of the light control layer AR. When the content (e.g., the amount) of the coloring agent CR contained in the light control layer AR is smaller than about 0.01 wt %, the light in the set or specific wavelength range may not be sufficiently absorbed, and thus, the color reproduction rate may not be improved. When the content (e.g., the amount) of the coloring agent CR contained in the light control layer AR exceeds about 5.00 wt %, the aggregation of the coloring agent CR may occur regardless of the presence or absence of the moisture WT (refer to FIG. 5B).

The desiccant AB may transmit visible light. The desiccant AB may transmit all lights having a wavelength equal to or greater than about 400 nm and equal to or smaller than about 700 nm. For example, the desiccant AB may be transparent in a visible light region. The desiccant AB may be in a first state before absorbing moisture and in a second state after absorbing moisture. The desiccant AB may have a color in the first state that is the same as a color in the second state. For example, the desiccant AB may be transparent both in the first state and in the second state.

A content (e.g., an amount) of the desiccant AB contained in the light control layer AR may be equal to or greater than about 0.01 wt % and equal to or smaller than about 5.00 wt % with respect to the total content (e.g., the total amount) of the light control layer AR. When the content (e.g., the amount) of the desiccant AB contained in the light control layer AR is smaller than about 0.01 wt %, the moisture in the light control layer AR may not be sufficiently removed, and as a result, the aggregation of the color agent CR may occur. When the content (e.g., the amount) of the desiccant AB contained in the light control layer AR exceeds about 5.00 wt %, the light control layer AR may become opaque.

The desiccant AB may include at least one selected from CaO, MgO, $CaCl_2$, $CaCO_3$, $CaZrO_3$, $CaTiO_3$, $SiO_2$, $Ca_2SiO_4$, $MgCl_2$, $P_2O_5$, $Li_2O$, $Na_2O$, BaO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$, and $Mg(ClO_4)_2$. As an example, the desiccant AB may include at least one selected from $BA(ClO_4)_2$ and $Mg(ClO_4)$.

According to an embodiment, the base portion BP may be formed of a base resin including at least one selected from an acrylate monomer and an epoxy monomer. The base resin may contain about 25 wt % or more and about 35 wt % or less of at least one selected from the acrylate monomer and the epoxy monomer, about 0.01 wt % or more and about 5.00 wt % or less of a photoinitiator, about 25 wt % or more and about 35 wt % or less of a curable resin, and the remainder (e.g., a remaining wt % of the base resin) may be (e.g., consist of) additives.

The photoinitiator may be one selected from 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-2-hydroxyethoxy phenyl]-2-methyl-1-propanone, and 2-hydroxy-1-{4-[4-2-hydroxy-2-methyl-propionyl-benzyl]-phenyl}-2-methylpropan-1-one.

In some embodiments, the photoinitiator may be one selected from 2-methyl-1[4-methylthio phenyl]-2-morpholinopropan-1-one, 2-benzyl-2-dimethylamino-1-4-morpholinophenyl-butanone-1,2-dimethylamino-2-4-methyl-benzyl-1-4-morpholin-4-yl-phenyl-butan-1-one, 2,4,6-trimethylbenzoyl-diphenylphosphine oxide, 2,4,6-trimethylbenzoyl-diphenyl phosphinate, bis 2,4,6-trimethylbenzoyl-phenylphosphineoxide, [14-phenylsulfanylbenzoyl heptylideneamino]benzoate, [1-[9-ethyl-6-2-methylbenzoyl carbazol-3-yl]ethylideneamino] acetate, and bis 2,4-cyclopentadienyl bis(2,6-difluoro-3-[1-pyrrol] phenyl)-titanium (IV).

The curable resin may be an acrylic-based resin and/or an epoxy-based resin, however, this is merely one example. Various suitable resins may be utilized as the curable resin as long as the resins do not exert influences on a light transmittance of the light control layer AR.

Figure 6A:
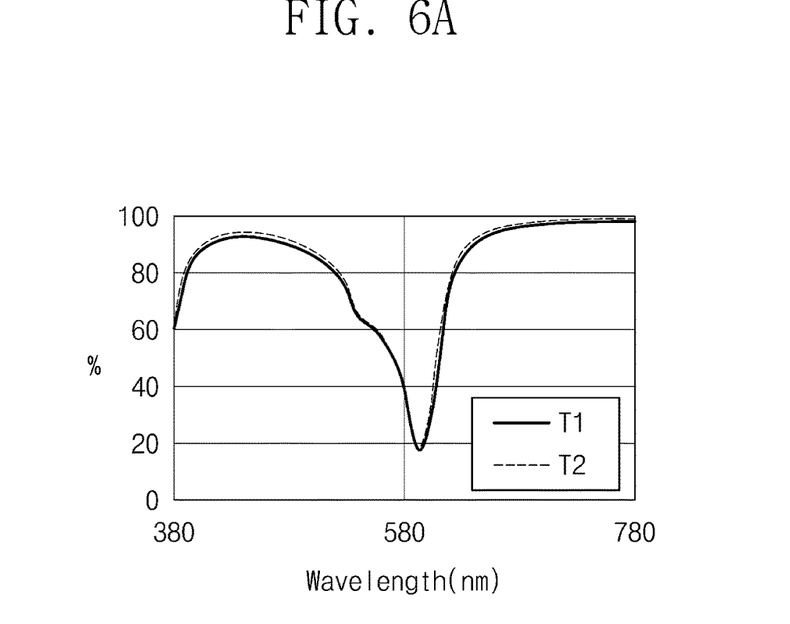
FIG. 6A is a graph showing a UV-Vis spectrum of a light control layer according to an embodiment of the present disclosure.
Figure 6B:
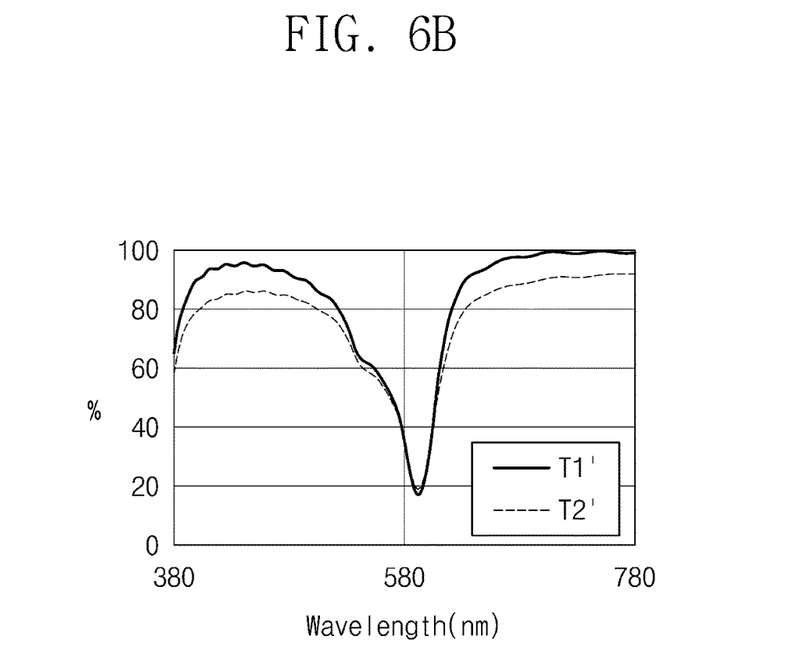
FIG. 6B is a graph showing a UV-Vis spectrum of a light control layer according to a comparative example.

FIG. 6A is a graph showing a UV-Vis spectrum of a light control layer (hereinafter, referred to as a light control layer of an embodiment example) that includes a desiccant and a coloring agent. FIG. 6B is a graph showing a UV-Vis spectrum of a light control layer (hereinafter, referred to as a light control layer of a comparative example) that includes a coloring agent and does not include a desiccant. In FIG. 6A, a solid line T1 represents a light transmittance (%) of the light control layer of the embodiment example as a function of a wavelength (nm) at an initial stage. A dotted line T2 represents a light transmittance (%) of the light control layer of the embodiment example as a function of a wavelength after the light control layer is exposed to a temperature of about 85° C. and a humidity of about 85% for about 500 hours. In FIG. 6B, a solid line T1' represents a light transmittance (%) of a light control layer of the comparative example as a function of a wavelength (nm) at an initial stage. A dotted line T2' represents a light transmittance (%) of the light control layer of the comparative example as a function of a wavelength after the light control layer is exposed to a temperature of about 85° C. and a humidity of about 85% for about 500 hours.

Referring to FIGS. 6A and 6B, it is observed that the light transmittance of each of the light control layer of the comparative example and the light control layer of the embodiment example sharply decreases in a wavelength range equal to or greater than about 580 nm and equal to or smaller than about 600 nm (e.g., a light absorption peak is seen in this range at both the initial stage and after exposure to heat and humidity). Through this, it is observed that a maximum absorption wavelength range of the coloring agent contained in the light control layer of the comparative example and the light control layer of the embodiment example is equal to or greater than about 580 nm and equal to or smaller than about 600 nm.

As represented by the solid line T1 and the dotted line T2 in FIG. 6A, different from the light control layer of the comparative example, it is observed that the light transmittance of the light control layer of the embodiment example is maintained in the wavelength range equal to or greater than about 380 nm and equal to or smaller than about 550 nm and in the wavelength range equal to or greater than about 620 nm and equal to or smaller than about 780 nm even after the light control layer is exposed to the temperature of about 85° C. and the humidity of about 85% for about 500 hours. Through this, it is observed that the decrease in light transmittance of the light control layer may be reduced even though the light control layer is exposed to high temperature and high humidity conditions because the light control layer of the embodiment example includes the desiccant. For example, the desiccant may absorb the moisture and prevent or reduce the rearrangement and/or aggregation of the hydrophobic coloring agent.

As shown by the solid line T1' and the dotted line T2' in FIG. 6B, when the light control layer of the comparative example is exposed to the temperature of about 85° C. and the humidity of about 85% for about 500 hours, light transmittance decreases in the wavelength range equal to or greater than about 380 nm and equal to or smaller than about 550 nm and in the wavelength range equal to or greater than about 620 nm and equal to or smaller than about 780 nm. Through this, it is observed that when the light control layer including only the coloring agent (e.g., without including the desiccant) is exposed to the high temperature and high humidity conditions, light transmittance decreases over time. This is because the hydrophobic coloring agent is rearranged and aggregated in the light control layer by the moisture infiltrated therein.

For example, because the light control layer of the embodiment example includes the desiccant (unlike the light control layer of the comparative example), aggregation of the coloring agent may be prevented or reduced. As a result, the decrease in light transmittance of the light control layer may be controlled or reduced even when the light control layer is exposed to high temperature and high humidity conditions.

According to the above, the display device includes the light control layer including the base portion, the coloring agent, and the desiccant, and thus, the color reproduction rate of the display device may be maintained even though the display device is exposed to moisture.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although embodiments of the present disclosure have been described, it is understood that the present disclosure is not limited to these embodiments, and that various suitable changes and modifications can be made by one ordinary skilled in the art within the spirit and scope of the present disclosure as hereinafter claimed.

Therefore, the disclosed subject matter should not be limited to any single embodiment described herein, and the scope of the present disclosure shall be determined according to the following claims and equivalents thereof.

What is claimed is:

1. A display device comprising:
    a display panel; and
    a light control layer on the display panel and comprising:
        a base portion,
        a coloring agent having a maximum absorption wavelength in a wavelength range of about 580 nm to about 600 nm, and
        a desiccant.

2. The display device of claim 1, wherein the desiccant is in a first state before absorbing moisture and in a second state after absorbing the moisture, and
    a color of the desiccant in the first state is the same as a color of the desiccant in the second state.

3. The display device of claim 1, wherein the desiccant transmits visible light.

4. The display device of claim 1, wherein the light control layer comprises about 0.01 wt % to about 5.00 wt % of the desiccant with respect to a total content of the light control layer.

5. The display device of claim 1, wherein the desiccant comprises at least one selected from CaO, MgO, $CaCl_2$, $CaCO_3$, $CaZrO_3$, $CaTiO_3$, $SiO_2$, $Ca_2SiO_4$, $MgCl_2$, $P_2O_5$, $Li_2O$, $Na_2O$, BaO, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $SrCl_2$, $YCl_3$, $CuCl_2$, CsF, $TaF_5$, $NbF_5$, LiBr, $CaBr_2$, $CeBr_3$, $SeBr_4$, $VBr_3$, $MgBr_2$, $BaI_2$, $MgI_2$, $Ba(ClO_4)_2$, and $Mg(ClO_4)_2$.

6. The display device of claim 1, wherein the coloring agent comprises at least one selected from an anthraquinone-based compound, a phthalocyanine-based compound, an azo-based compound, a perylene-based compound, a xanthene-based compound, a diimmonium-based compound, a dipyrromethene-based compound, a tetraazaporphyrin-based compound, a porphyrin-based compound, a squarylium-based compound, an oxazine-based compound, a triarylmethane-based compound, and a cyanine-based compound.

7. The display device of claim 1, wherein the light control layer comprises about 0.01 wt % to about 5.00 wt % of the coloring agent with respect to a total content of the light control layer.

8. The display device of claim 1, wherein the coloring agent has a higher hydrophobicity than the desiccant.

9. The display device of claim 1, further comprising a barrier wall,
wherein the display panel comprises:
a base layer; and
a display element layer on the base layer and comprising a light emitting area and a non-light-emitting area, and
wherein the barrier wall is on the display element layer, is covered by the light control layer, and overlaps the non-light-emitting area.

10. The display device of claim 1, further comprising a sensor layer between the display panel and the light control layer,
wherein the sensor layer is directly on the display panel.

11. The display device of claim 1, wherein the base portion comprises a base resin comprising at least one selected from an acrylate monomer and an epoxy monomer.

12. The display device of claim 11, wherein the base resin comprises:
about 25 wt % to about 35 wt % of at least one selected from the acrylate monomer and the epoxy monomer,
about 0.01 wt % to about 5.00 wt % of a photoinitiator, and
about 25 wt % to about 35 wt % of a curable resin, and the remainder of the base resin comprises one or more additives.

13. A display device comprising:
a display panel comprising first, second, and third light emitting elements spaced apart from each other when viewed in a plane, wherein the first, second, and third light emitting elements are to emit lights having different wavelengths from each other; and
a light control layer on the display panel and comprising:
a base portion,
a coloring agent having a maximum absorption wavelength in a wavelength range of about 580 nm to about 600 nm, and
a desiccant.

14. The display device of claim 13, wherein each of the first, second, and third light emitting elements comprises:
a first electrode;
a hole transport region on the first electrode;
a light emitting layer on the hole transport region;
an electron transport region on the light emitting layer;
a second electrode on the electron transport region; and
a capping layer on the second electrode.

15. The display device of claim 13, wherein the first light emitting element is to emit a red light, the second light emitting element is to emit a green light, and the third light emitting element is to emit a blue light.

16. The display device of claim 13, wherein the light control layer overlaps the first, second, and third light emitting elements.

17. The display device of claim 13, further comprising a barrier wall,
wherein the display panel comprises a display element layer comprising the first, second, and third light emitting elements,
the display element layer comprises:
a light emitting area in which the first, second, and third light emitting elements are disposed, and
a non-light-emitting area around the light emitting area, and
the barrier wall is on the display element layer, is covered by the light control layer, and overlaps the non-light-emitting area.

18. The display device of claim 17, wherein the barrier wall comprises a black pigment and/or a black dye.

19. The display device of claim 13, wherein the light control layer comprises about 0.01 wt % to about 5.00 wt % of the desiccant with respect to a total content of the light control layer.

20. The display device of claim 13, wherein the light control layer comprises about 0.01 wt % to about 5.00 wt % or less of the coloring agent with respect to a total content of the light control layer.

* * * * *